United States Patent
Chyi et al.

(10) Patent No.: US 9,640,672 B2
(45) Date of Patent: May 2, 2017

(54) DIODE DEVICE AND METHOD FOR MANUFACTURING THE SAME

(71) Applicants: NATIONAL CENTRAL UNIVERSITY, Taoyuan (TW); DELTA ELECTRONICS, INC., Taoyuan (TW)

(72) Inventors: Jen-Inn Chyi, Taoyuan (TW); Bo-Shiang Wang, Taoyuan (TW); Chun-Chieh Yang, Taoyuan (TW); Geng-Yen Lee, Taoyuan (TW)

(73) Assignees: National Central University, Jhongli, Taoyuan County (TW); Delta Electronics, Inc., Taoyuan (TW)

( * ) Notice: Subject to any disclaimer, the term of this patent is extended or adjusted under 35 U.S.C. 154(b) by 0 days.

(21) Appl. No.: 15/040,539

(22) Filed: Feb. 10, 2016

(65) Prior Publication Data
US 2016/0315204 A1 Oct. 27, 2016

(30) Foreign Application Priority Data

Apr. 24, 2015 (TW) .............................. 104113164 A

(51) Int. Cl.
| | | |
|---|---|---|
| H01L 21/00 | (2006.01) |
| H01L 29/872 | (2006.01) |
| H01L 29/20 | (2006.01) |
| H01L 29/205 | (2006.01) |
| H01L 29/66 | (2006.01) |
| H01L 29/47 | (2006.01) |

(52) U.S. Cl.
CPC ...... *H01L 29/8725* (2013.01); *H01L 29/2003* (2013.01); *H01L 29/205* (2013.01); *H01L 29/475* (2013.01); *H01L 29/66143* (2013.01); *H01L 29/66212* (2013.01); *H01L 29/872* (2013.01)

(58) Field of Classification Search
CPC ............... H01L 29/2003; H01L 29/205; H01L 29/66143; H01L 29/8725
See application file for complete search history.

(56) References Cited

U.S. PATENT DOCUMENTS 5,612,567 A * 3/1997 Baliga .................. H01L 29/872
                                                      257/475
6,403,874 B1 * 6/2002 Shakouri ................ H01J 45/00
                                                      136/201

* cited by examiner

*Primary Examiner* — Richard Booth
(74) *Attorney, Agent, or Firm* — Muncy, Geissler, Olds & Lowe, P.C.

(57) ABSTRACT

A diode device including a III-N compound layer is provided. The III-N compound layer has a channel region therein. A cathode region is located on the III-N compound layer. A first anode region is located on the III-N compound layer and extends into the III-N compound layer. The bottom of the first anode region is under the channel region. A second anode region is located on the III-N compound layer between the cathode region and the first anode region, and extends into the III-N compound material layer. The second anode region includes a high-energy barrier region. The high-energy barrier region adjoins a sidewall of the first anode region. A method for manufacturing a diode device is also provided.

22 Claims, 14 Drawing Sheets

DIODE DEVICE AND METHOD FOR MANUFACTURING THE SAME

CROSS REFERENCE TO RELATED APPLICATIONS

This Application claims priority of Taiwan Patent Application No. 104113164, filed on Apr. 24, 2015, the entirety of which is incorporated by reference herein.

BACKGROUND OF THE DISCLOSURE

Field of the Invention

The present invention relates to a diode device and a method for manufacturing the same, and in particular, it relates to a Schottky diode having the properties of low leakage current and high breakdown voltage.

Description of the Related Art

A Schottky diode composed of gallium nitride (GaN) has properties such as high breakdown voltage, high electric current and suitable for performing at high temperature, and therefore is compatible for the application in high-power electronic circuits. Furthermore, the polarization effect, a characteristic property of gallium nitride, results in the AlGaN/GaN heterostructure having a high-concentration of two-dimensional electron gas (2DEG), and therefore, it is possible to provide transmission under low series resistance and high current.

However, the Schottky diode formed by such a heterostructure has a problem wherein the turn-on voltage is too large due to the Schottky metals formed on aluminum gallium nitride (AlGaN) having a wide bandgap. In order to solve the problem, the traditional manufacturing methods for Schottky diodes developed for decreasing the turn-on voltage are formed by more complex processes with higher processing cost and the tendency for there to be a greater leakage current in the Schottky diodes, negatively affecting to the performance of the Schottky diodes.

As a result, it is necessary to develop a brand new diode device and a method for manufacturing the same to solve or improve the described problems, and therefore to provide a Schottky diode having the properties of low leakage current and high breakdown voltage.

BRIEF SUMMARY OF THE DISCLOSURE

An embodiment of the disclosure provides diode device, including a III-N (Group IIIA nitride, a nitride of a Group IIIA element) compound layer, a cathode region, a first anode region and a second anode region. The III-N compound layer includes a channel region therein. The cathode region is disposed overlying the III-N compound layer. The first anode region is disposed overlying the III-N compound layer and extends into the III-N compound layer. The bottom of the first anode region is disposed underlying the channel region. The second anode region is disposed overlying the III-N compound layer between the cathode region and the first anode region and extends into the III-N compound layer. The second anode region includes a high-energy barrier region adjacent to a sidewall of the first anode region.

In the embodiment, it is preferred that the high-energy barrier region partially covers the sidewall of the first anode region and exposes a part, neighboring the channel region, of the sidewall.

In the embodiment, it is preferred that a top of the high-energy barrier region is disposed in the III-N compound layer.

In the embodiment, it is preferred that a top of the high-energy barrier region is coplanar with the top surface of the III-N compound layer.

In the embodiment, it is preferred that the high-energy barrier region includes a material including the nitride in the III-N compound layer, and the material further includes halogen atoms.

In the embodiment, it is preferred that the high-energy barrier region comprises an oxide of the Group IIIA element composed by the nitride in the III-N compound layer.

In the embodiment, it is preferred that the high-energy barrier region includes an insulating material.

In the embodiment, it is preferred that the diode device further includes a third anode region disposed overlying the III-N compound layer, and the second anode region is disposed between the third anode region and the first anode region.

In the embodiment, it is preferred that the III-N compound layer includes a first III-N compound layer, a second compound layer and a third III-N compound layer sequentially stacked from bottom to top, the channel region is neighboring an interface between the first III-N compound layer and the second III-N compound layer, and the bottom of the high-energy barrier region is disposed in the second III-N compound layer.

In the embodiment, it is preferred that the III-N compound layer layer further includes a fourth III-N compound layer disposed between the first III-N compound layer and the second III-N compound layer, and the sidewall, exposed by the high-energy barrier region, of the first anode region includes a part above the third III-N compound layer.

In the embodiment, it is preferred that the diode device further includes a first metal layer and a second metal layer, the first metal layer is disposed overlying the III-N compound layer and located away from the cathode region, and the second metal layer extends from the first anode region and the second anode region to the first metal layer.

Another embodiment of the disclosure provides a method for manufacturing a diode device. First, a III-N (Group IIIA nitride, a nitride of a Group IIIA element) compound layer is provided. The III-N compound layer includes a channel region therein. Then, a cathode region is formed overlying the III-N compound layer. Next, a first anode region is formed overlying the III-N compound layer. The first anode region extends into the III-N compound layer. The bottom of the first anode region is disposed underlying the channel region. Finally, a second anode region is formed overlying the III-N compound layer between the cathode region and the first anode region. The second anode region extends into the III-N compound layer. The second anode region includes a high-energy barrier region adjacent to a side-wall of the first anode region.

In the embodiment, it is preferred that the high-energy barrier region partially covers the sidewall of the first anode region and exposes a part, neighboring the channel region, of the sidewall.

In the embodiment, it is preferred that a top of the high-energy barrier region is disposed in the III-N compound layer.

In the embodiment, it is preferred that the top of the high-energy barrier region is coplanar with a top surface of the III-N compound layer.

In the embodiment, it is preferred that the high-energy barrier region is formed by doping halogen atoms into a material including the nitride in the III-N compound layer.

In the embodiment, it is preferred that the high-energy barrier region is formed by oxidizing a material including the nitride in the III-N compound layer into an oxide of the Group IIIA element.

In the embodiment, it is preferred that the high-energy barrier region includes an insulating material.

In the embodiment, it is preferred that the method further includes forming a third anode region overlying the III-N compound layer, and the second anode region is disposed between the third anode region and the first anode region.

In the embodiment, it is preferred that the III-N compound layer includes a first III-N compound layer, a second III-N compound layer and a third III-N compound layer sequentially stacked from bottom to top, the channel region is neighboring an interface between the first III-N compound layer and the second III-N compound layer, and the bottom of the high-energy barrier region is disposed in the second III-N compound layer.

In the embodiment, it is preferred that the III-N compound layer further includes a fourth III-N compound layer disposed between the first III-N compound layer and the second III-N compound layer, and the sidewall, exposed by the high-energy barrier region, of the first anode region includes a part above the third III-N compound layer.

In the embodiment, it is preferred that the method further includes forming a first metal layer overlying the III-N compound layer, and forming a second metal layer extending from the first anode region and the second anode region to the first metal layer. It is also preferred that the first metal layer is located away from the cathode region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE DISCLOSURE

The following description is of the best-contemplated mode of carrying out the invention. This description is made for the purpose of illustrating the general principles of the invention and should not be taken in a limiting sense. The scope of the invention is best determined by reference to the appended claims.

Moreover, the formation of a first feature over and on a second feature in the description that follows may include embodiments in which the first and second features are formed in direct contact, and may also include embodiments in which additional features may be formed between the first and second features, such that the first and second features may not be in direct contact.

Figure 1A:
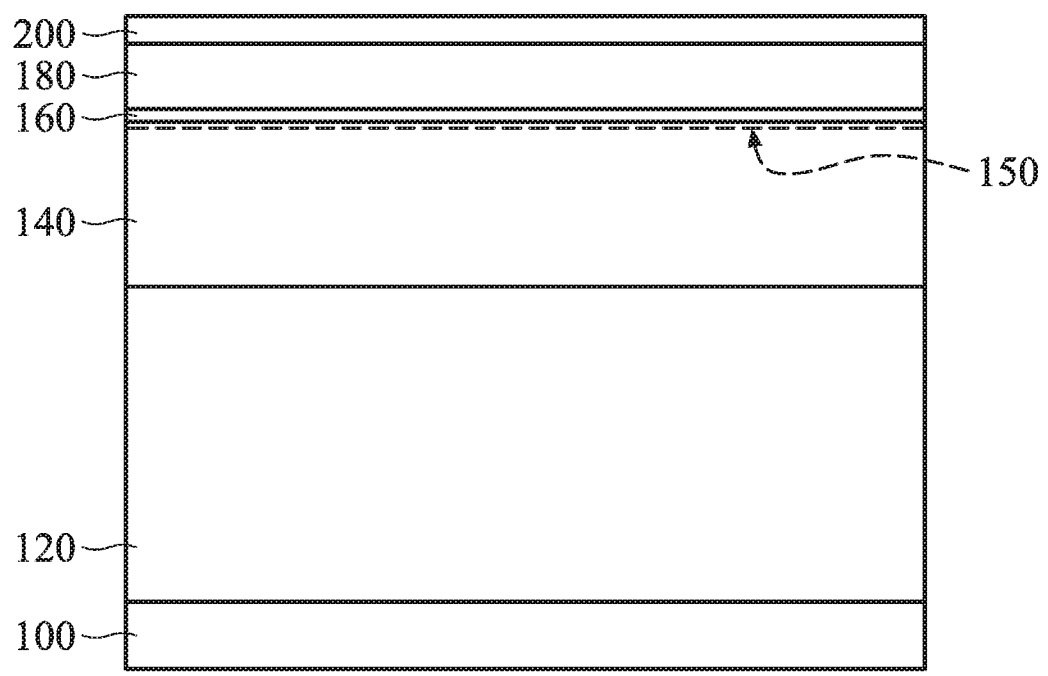
FIG. 1A schematically illustrates a cross-sectional view of a step or stage of a method for manufacturing a diode device according to one embodiment.
Figure 1B:
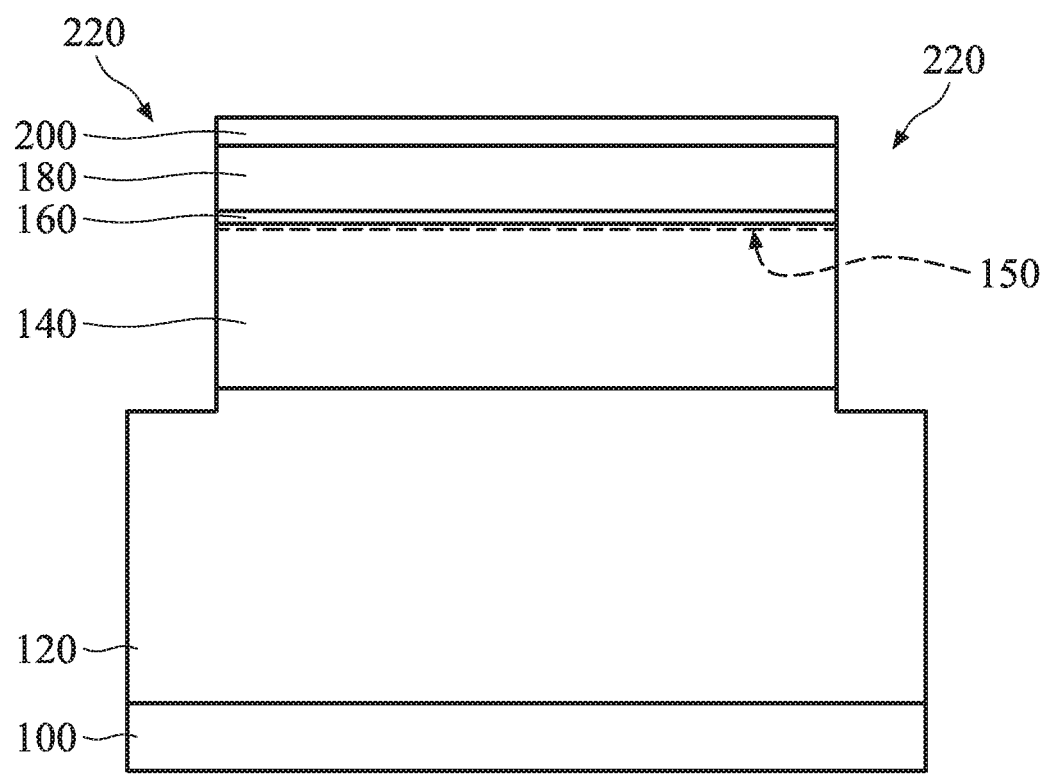
FIG. 1B schematically illustrates a cross-sectional view of a step or stage of a method for manufacturing a diode device according to one embodiment.
Figure 1C:
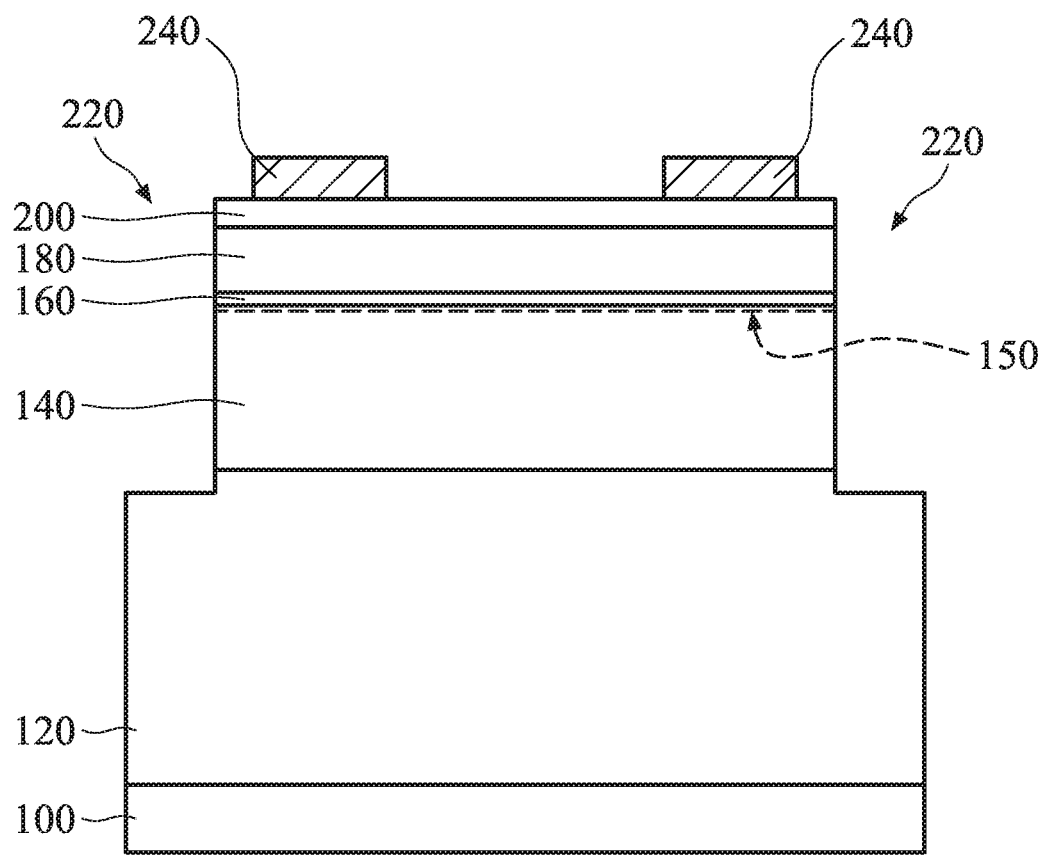
FIG. 1C schematically illustrates a cross-sectional view of a step or stage of a method for manufacturing a diode device according to one embodiment.
Figure 1D:
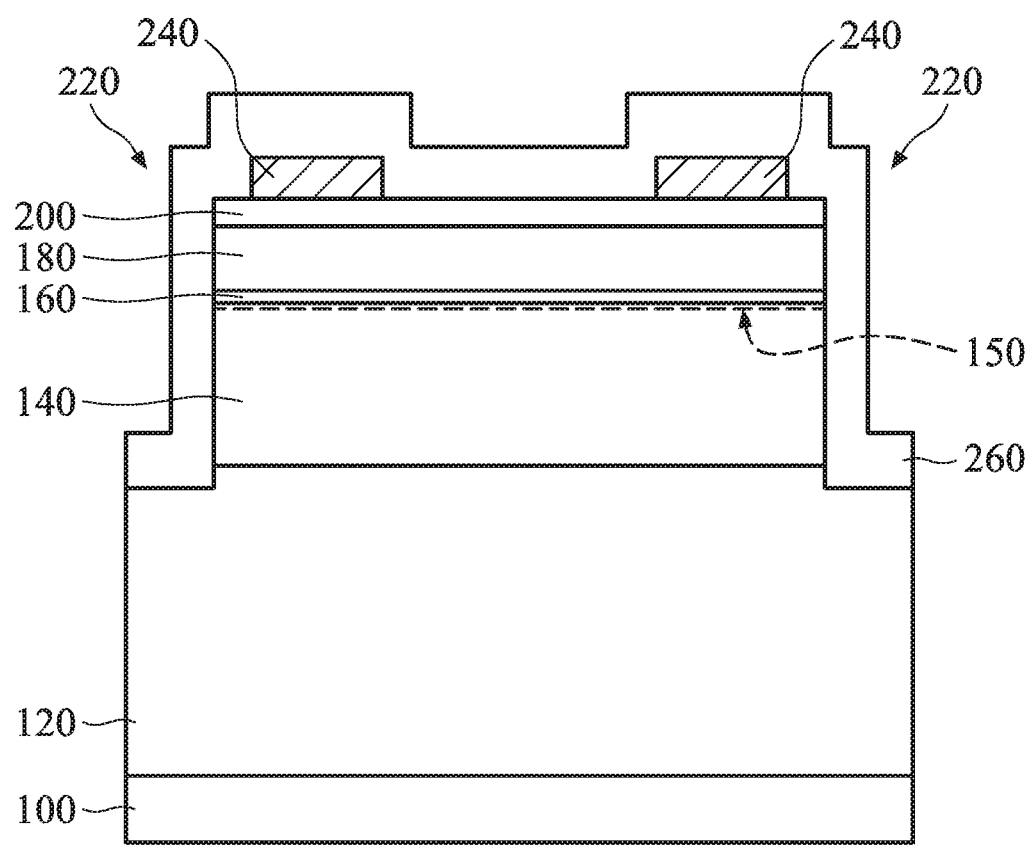
FIG. 1D schematically illustrates a cross-sectional view of a step or stage of a method for manufacturing a diode device according to one embodiment.
Figure 1E:
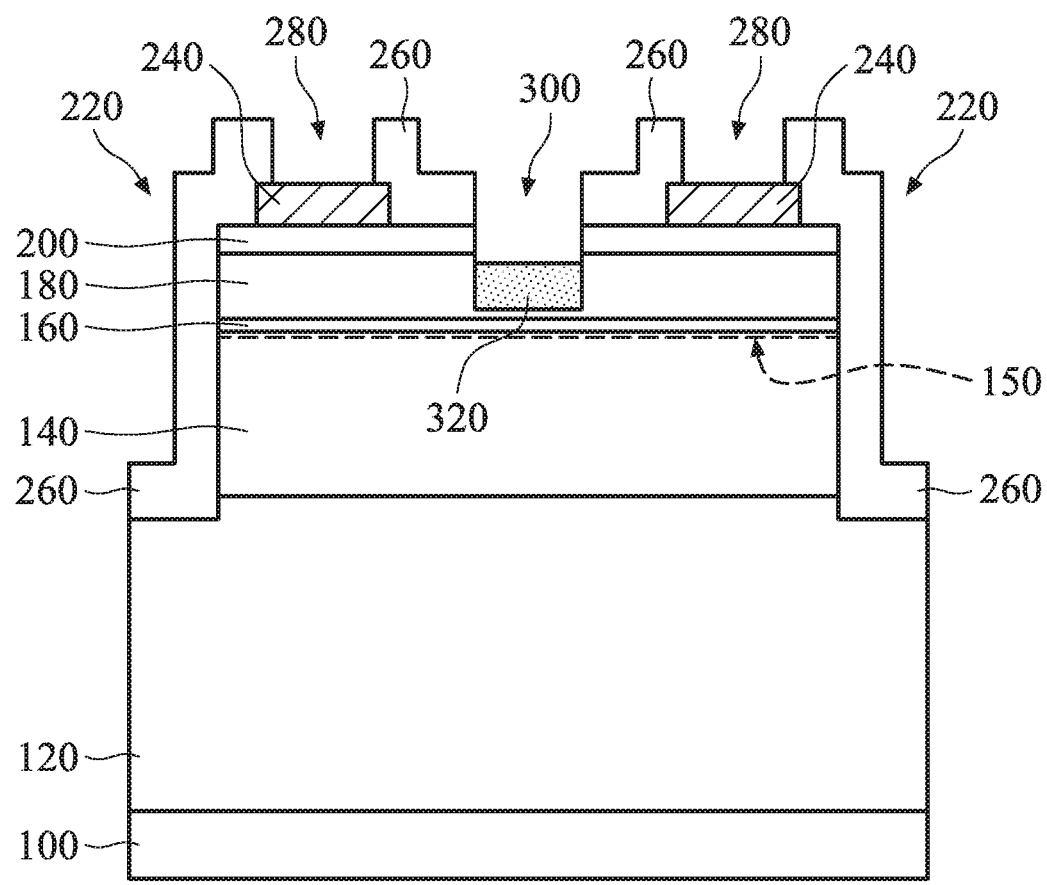
FIG. 1E schematically illustrates a cross-sectional view of a step or stage of a method for manufacturing a diode device according to one embodiment.
Figure 1F:
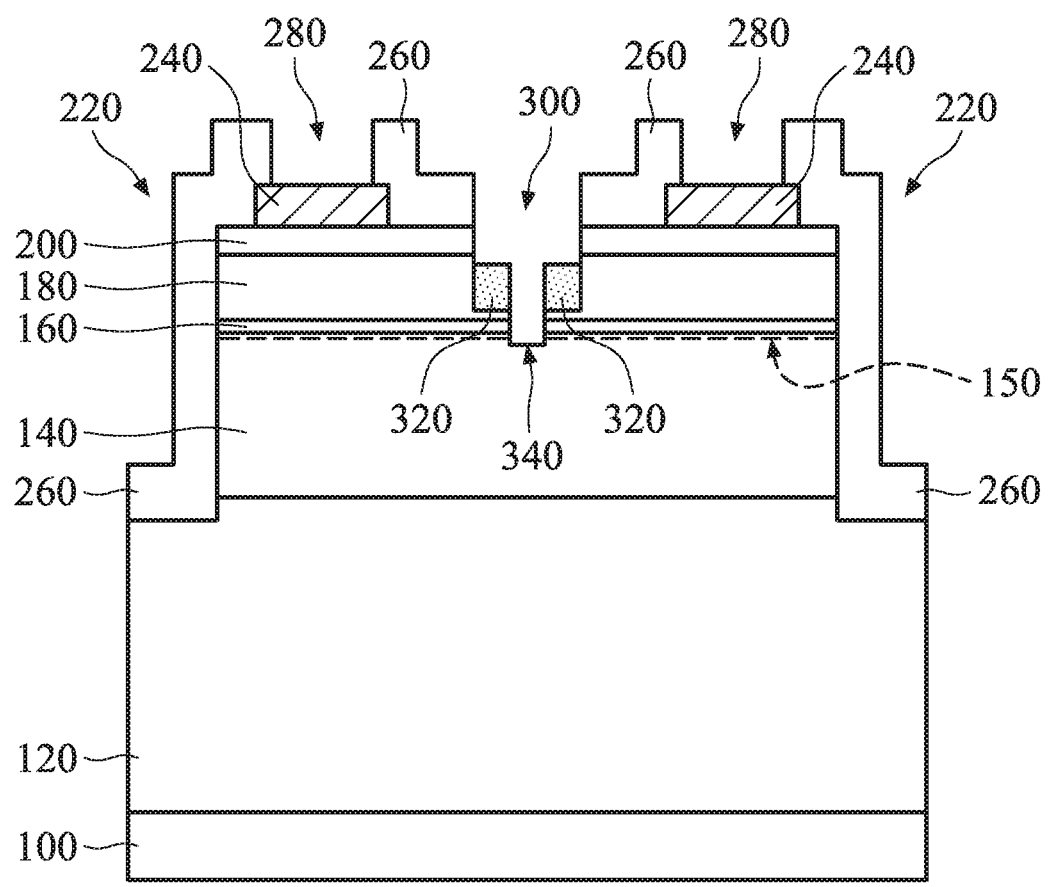
FIG. 1F schematically illustrates a cross-sectional view of a step or stage of a method for manufacturing a diode device according to one embodiment.
Figure 1G:
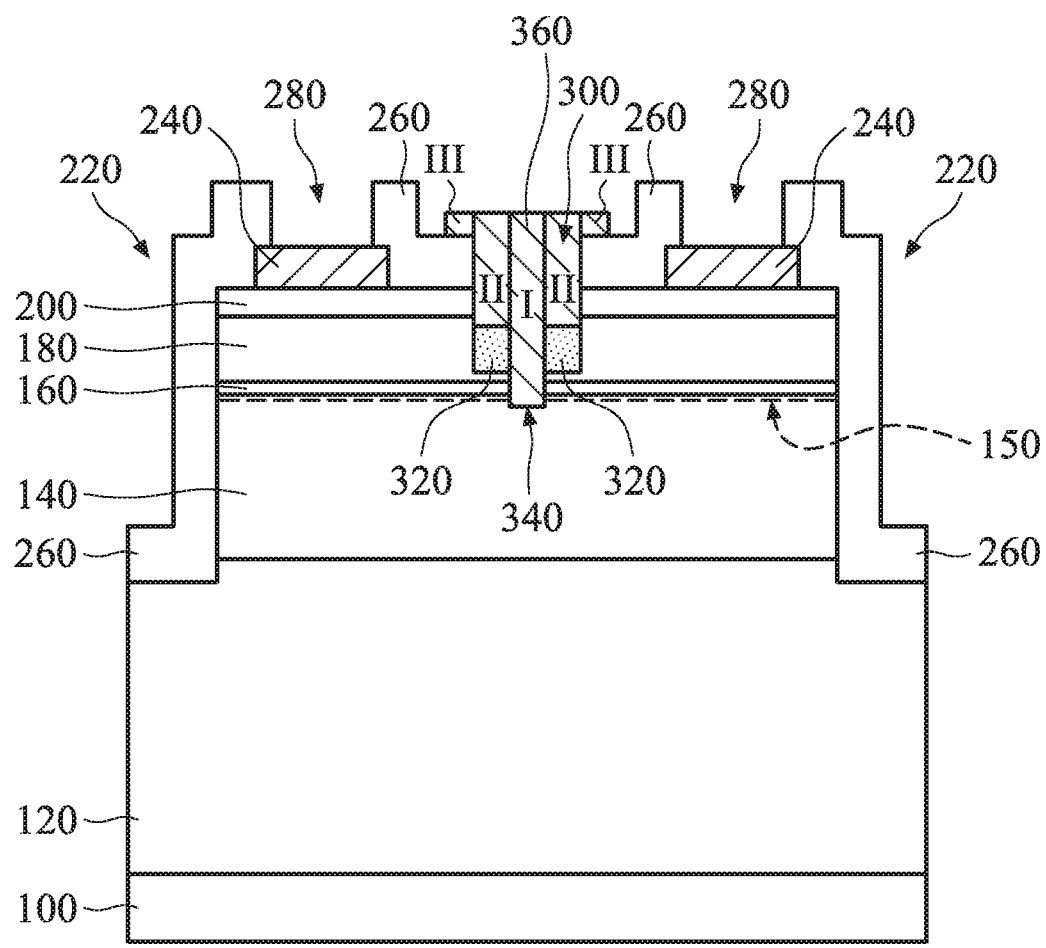
FIG. 1G schematically illustrates a cross-sectional view of a step or stage of a method for manufacturing a diode device according to one embodiment.
Figure 1H:
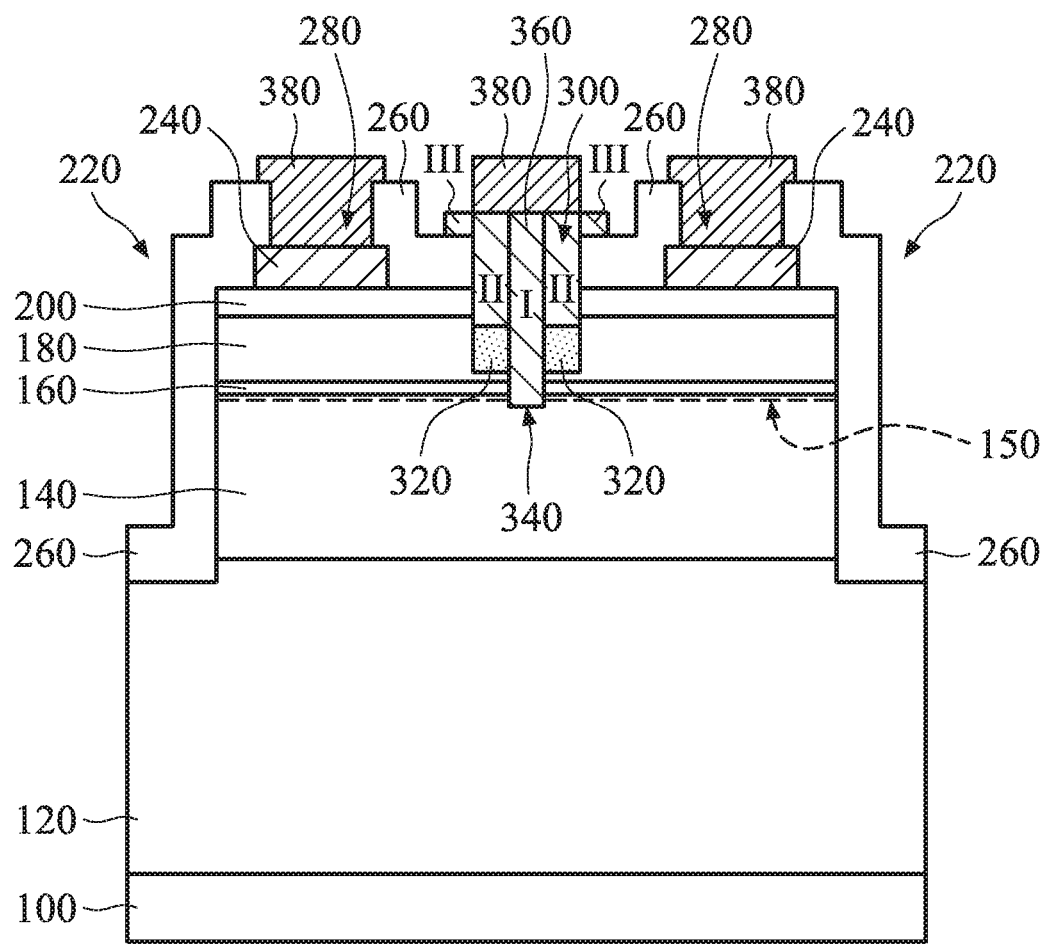
FIG. 1H schematically illustrates a cross-sectional view of a step or stage of a method for manufacturing a diode device according to one embodiment.

Referring to FIG. 1H, a diode device according to one embodiment of the invention is described, and FIG. 1H schematically illustrates a cross-sectional view of the diode device according to one embodiment of the invention. The diode device comprises a substrate 100. In this embodiment, the substrate 100 may comprise silicon (e.g. silicon (111)), gallium nitride, silicon carbide, sapphire or other suitable materials. A buffer layer 120 is disposed overlying the substrate 100. In this embodiment, the buffer layer 120 may comprise aluminum nitride (AlN), aluminum gallium nitride, a combination thereof or other suitable materials.

A compound layer of a nitride of a Group IIIA element (hereafter referred as "III-N compound layer") is disposed overlying the buffer layer 120, and is surrounded by an isolation region 220 for defining active regions, resulting in the resulting devices being isolated from each other. In one embodiment, the isolation region 220 is an opening extending downwardly from the III-N compound layer to a position where the buffer layer 120 is partially exposed, as shown in FIG. 1H. In other embodiment, however, the isolation region 220 can be constructed by the III-N compound layer doped with ions, and in this case, an upper surface of the isolation region 220 is coplanar with an upper surface of the III-N compound layer of an active region. In this Embodiment, the III-N compound layer comprises a first compound layer 140, a second III-N compound layer 180, a third III-N compound layer 200 and a fourth III-N compound layer 160. In other embodiments, the III-N compound layer merely has the first III-N compound layer 140, the second III-N compound layer 180 and the third III-N compound layer 200, but do not comprise the fourth III-N compound layer 160.

In this embodiment, the first III-N compound layer 140 may comprise GaN, AlGaN or other suitable nitrides of Group IIIA elements, the second III-N compound layer 180 may comprise AlGaN, AlInN, AlInGaN or other suitable nitrides of Group IIIA elements, the third III-N compound layer 200 may comprise GaN, AlN or other suitable nitrides of Group IIIA elements, and the fourth III-N compound layer 160 may comprise AlN or other suitable nitrides of Group IIIA elements.

In one embodiment, the III-N compound layer comprises the first III-N compound layer 140, the fourth III-N compound layer 160, the second III-N compound layer 180 and the third III-N compound layer 200 sequentially stacked from bottom to top where the first III-N compound layer 140, the second III-N compound layer 180, the third III-N compound layer 200 and the fourth III-N compound layer 160 are terminal surface of Group III with a direction of [0001]. In the other embodiment, the III-N compound layer comprises the second III-N compound layer 180, the fourth III-N compound layer 160, the first III-N compound layer 140 and the third III-N compound layer 200 sequentially stacked from bottom to top where the first III-N compound layer 140, the second III-N compound layer 180, the third III-N compound layer 200 and the fourth III-N compound layer 160 may be terminal surface of Group N with a direction of [000-1].

In this embodiment, there is two-dimensional electron gas (2DEG) between the first III-N compound layer 140 and the second III-N compound layer 180. Specifically, the two-dimensional electron gas is in the first III-N compound layer 140 and neighboring an interface between the first III-N compound layer 140 and the second III-N compound layer 180, as shown by a two-dimensional electron gas 150. The two-dimensional electron gas is used to transmit electrical current and is utilized as a channel region of the diode device. When the III-N compound layer comprises the fourth III-N compound layer 160 disposed between the first III-N compound layer 140 and second III-N compound layer 180, it is possible to increase the carrier mobility and electron concentration of the two-dimensional electron gas. Furthermore, the third III-N compound layer 200 is capable of protecting the second III-N compound layer 180 from being oxidized.

A cathode region 240 is disposed overlying the third III-N compound layer 200 of the III-N compound layer. In this embodiment, the cathode region 240 is composed of a composite of Ti/Al/Ni/Au or other suitable metals comprising ohmic metals.

A dielectric layer 260 is conformally disposed overlying the cathode region 240 and the third III-N compound layer 200 of the III-N compound layer, and conformally extends to sidewalls and bottoms of the isolation region 220, and therefore covers the exposed buffer layer 120. The dielectric layer 260 comprises a plurality of openings 280 and an opening 300 between the openings 280. The openings 280 expose parts of the cathode region 240. The opening 300 extends from upper surface of the dielectric layer 260 into the second III-N compound layer 180. In this embodiment, the dielectric layer 260 can be composed of a single-layered or multi-layered structure. For example, the dielectric layer 260 may comprise $SiO_2$, $Si_3N_4$, $Al_2O_3$, $HfO_2$, a combination thereof or other suitable dielectric materials.

In this embodiment, there is a high-energy barrier region 320 in the second III-N compound layer 180 and below the opening 300. The high-energy barrier region 320 extends downwardly from the bottom of the opening 300, but extends into none of the fourth III-N compound layer 160 and the first III-N compound layer 140. That is, the bottom of the high-energy barrier region 320 is still located in the second III-N compound layer 180 of the III-N compound layer. Furthermore, the opening 300 of the dielectric layer 260 extends downwardly into the second III-N compound layer 180, and thus, the top of the high-energy barrier region 320 is disposed in the second III-N compound layer 180 of the III-N compound layer. In this embodiment, the high-energy barrier region 320 is formed by the material of the III-N compound layer doped with materials capable of carrying negative charge or negatively-charged ions (e.g. halogen atoms). For example, the halogen atoms may be fluorine atoms, chlorine atoms or other suitable halogen atoms. Furthermore, the high-energy barrier region 320 may also formed by an oxide of the Group IIIA elements of the second III-N compound layer 180 or an insulating material (e.g. $SiO_2$, $Si_3N_4$, $Al_2O_3$, AlON or other suitable insulating materials).

There is an opening 340 in the high-energy barrier region 320. The opening 340 extends downwardly from the bottom of the opening 300 through the fourth III-N compound layer 160 into the first III-N compound layer 140. In this embodiment, the bottom of the opening 340 is located below the two-dimensional electron gas 150, and the opening 340 is surrounded by the high-energy barrier region 320.

A metal layer 360 is disposed overlying the dielectric layer 260, extends into the opening 300 and the opening 340, and fills the opening 300 and opening 340. In this embodiment, the metal layer 360 comprises a composite structure of Ni/Au or other suitable metallic materials.

In this embodiment, the metal layer 360 and the high-energy barrier region 320 form an anode region of the diode device. The anode region can be generally divided into a first anode region I, a second anode region II and a third anode region III according to their functionality. The first anode region I comprises a Schottky metal and acts as an electrode region conducting main electric current. The second anode region II at least comprises a material with high-energy barrier to effectively disperse fringing electric fields of the anode. The third anode region III acts as a field-plate region for enhancing the dispersion of the electric fields.

Specifically, the first anode region I is composed of the metal layer 360 extending vertically and upwardly from the bottom of the opening 340 to above the dielectric layer 260. In other words, the first anode region I extends vertically and downwardly from the top of the metal layer 360 above the dielectric layer 260 into the first III-N compound layer 140, and the bottom of the first anode region I is located below the two-dimensional electron gas 150. Furthermore, the second anode region II is composed of the high-energy barrier region 320 and the metal layer 360 extending vertically and upwardly from the top of the high-energy barrier region 320 to above the dielectric layer 260. In other words, the second anode region II extends vertically and downwardly from the top of the metal layer 360 above the dielectric layer 260 into the second III-N compound layer 180, and the bottom of the second anode region II is located in the second III-N compound layer 180. The third anode region III is composed of the metal layer 360 beyond the first anode region I and the second anode region II, and the third anode region III is completely located above the dielectric layer 260 without extending into the opening 300 of the dielectric layer 260.

In this embodiment, the second anode region II surrounds the first anode region I, and the third anode region III surrounds the second anode region II and first anode region I in the top view. In this embodiment, the first anode region I, the second anode region II and the third anode region III are composed of the same metal layer 360. In other embodiments, the material of the first anode region I is different from that of the second anode region II and/or the third anode region III, depending on design requirements.

A metal layer 380 is disposed overlying the metal layer 360 and the dielectric layer 260, and fills the openings 280 of the dielectric layer 260 to form electrodes overlying the cathode region 240, the first anode region I and the second anode region II for electrically connecting to an exterior device. In this embodiment, the metal layer 380 comprises a composite structure of Ti/Au or Ti/Al, or other suitable metallic materials.

Figure 1I:
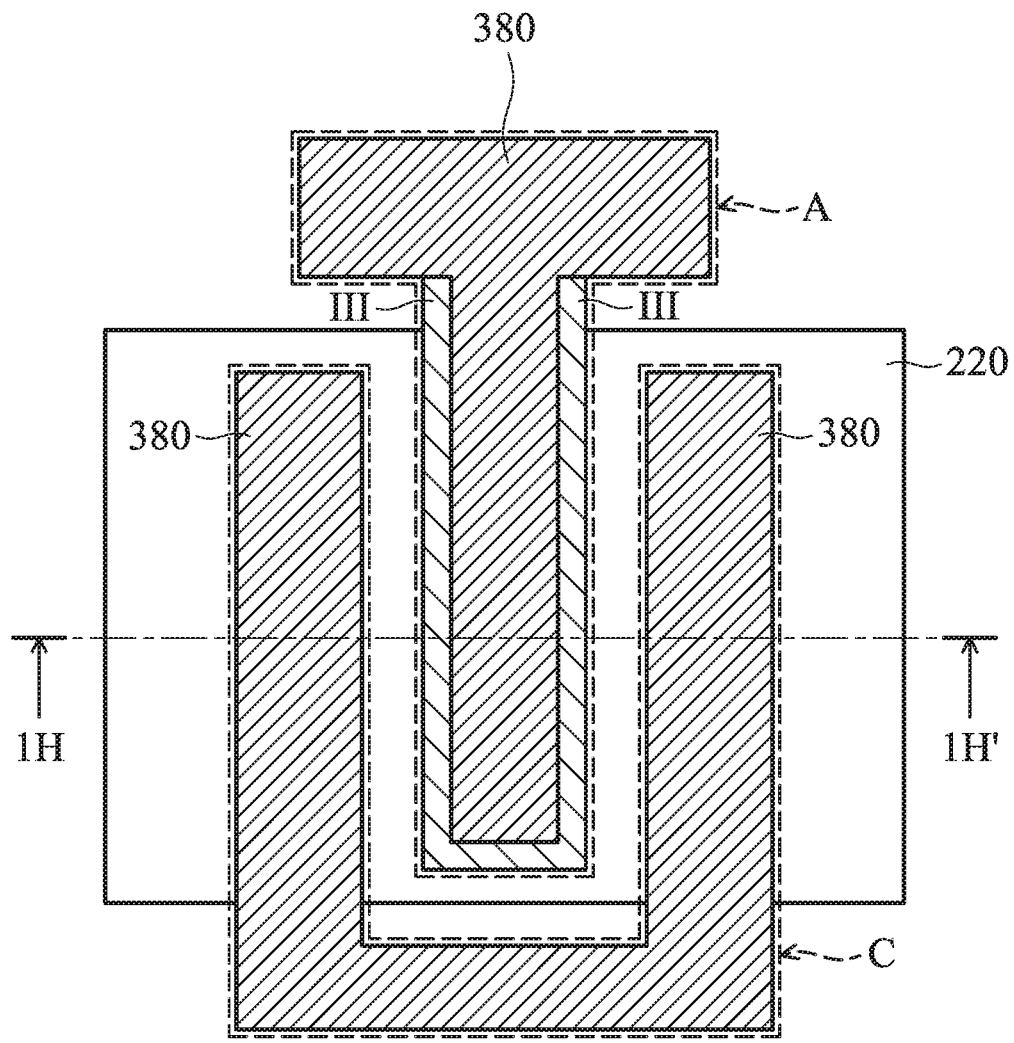
FIG. 1I schematically illustrates a plan view of a step or stage of a manufacturing method of a diode device according to one embodiment.

For more detailed description, FIG. 1I schematically illustrates a plan view of a step or stage of a manufacturing method of a diode device according to one embodiment, and FIG. 1H is a cross-sectional view along the line 1H-1H' in FIG. 1I, wherein the isolation region 220 defines the active regions of the diode devices. Referring to FIGS. 1H and 1I simultaneously, a cathode electrode C of the diode device is formed by a combination of the metal layer 380 filling the openings 280 and the underlying cathode region 240, and a anode electrode A of the diode device is formed by the metal layer 380 disposed directly on the first anode region I and the second anode region II together with the first anode region I, the second anode region II and the third anode region III.

Figure 2:
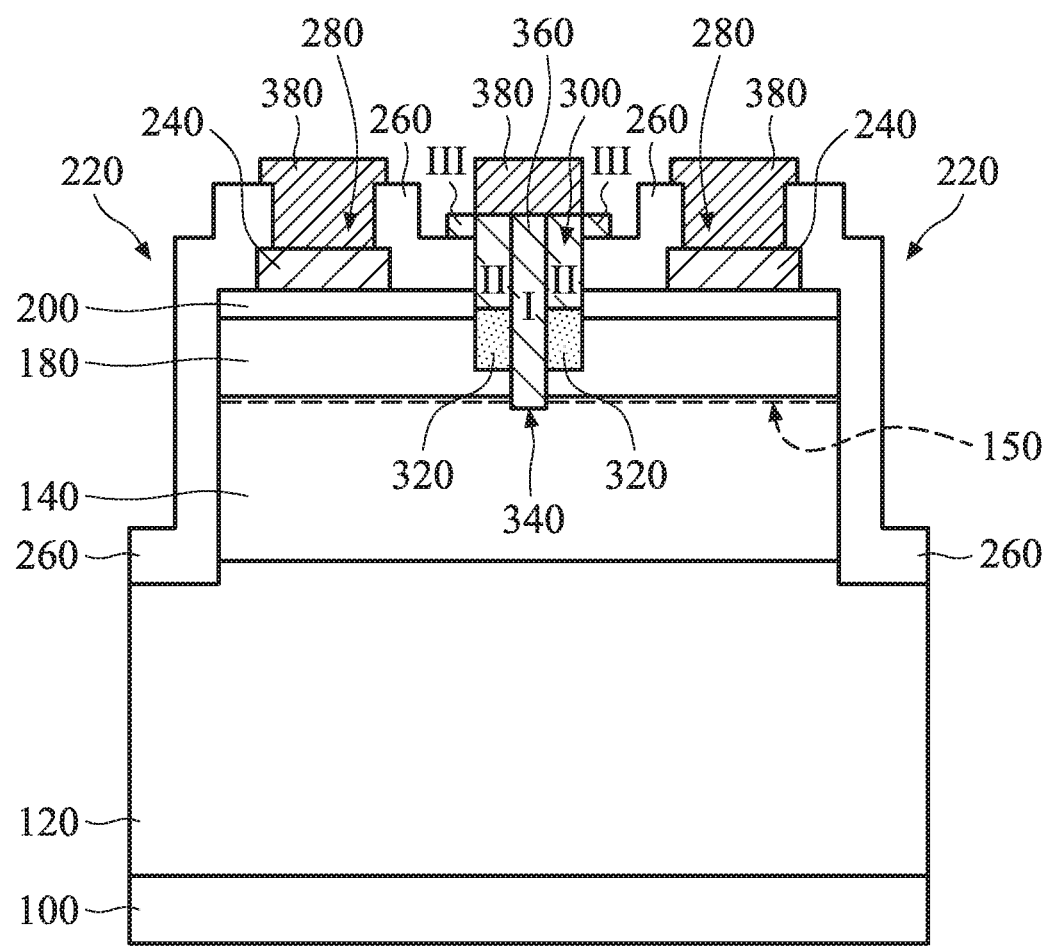
FIG. 2 schematically illustrates a cross-sectional view of a diode device according to one embodiment.
Figure 3:
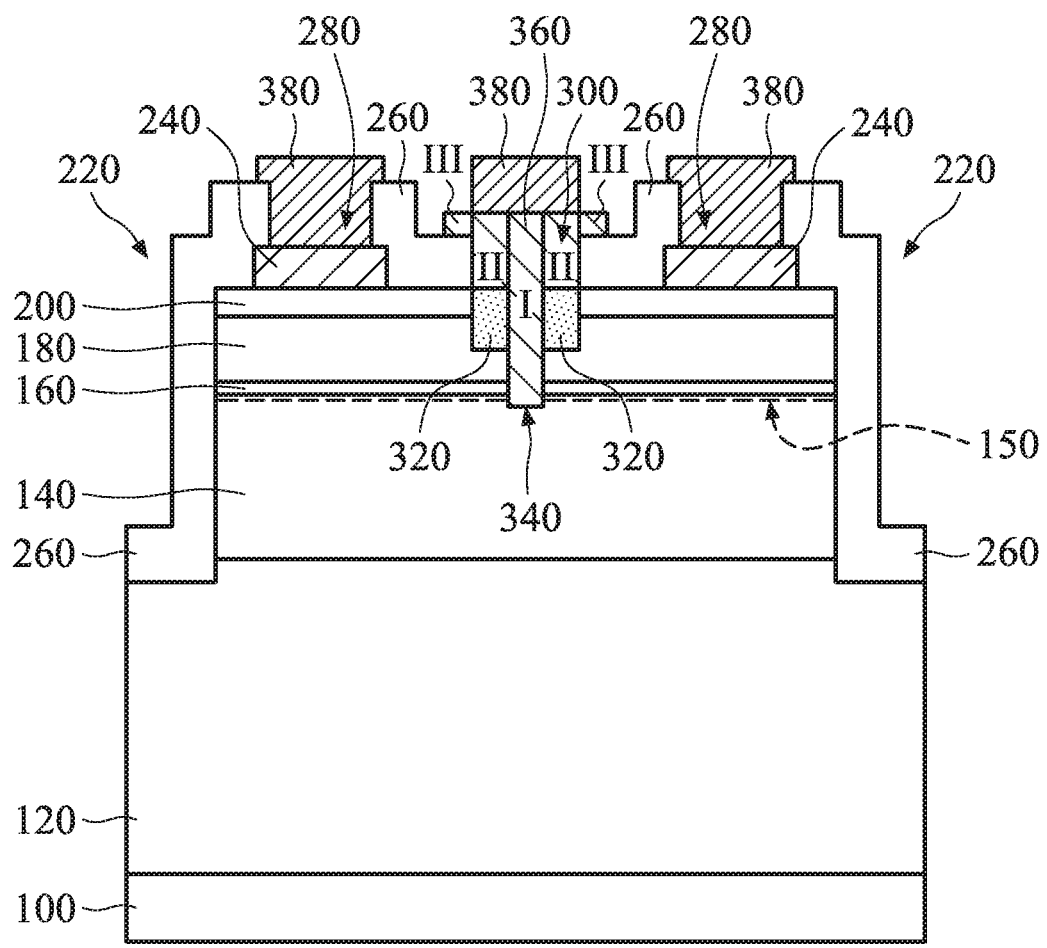
FIG. 3 schematically illustrates a cross-sectional view of a diode device according to one embodiment.
Figure 4:
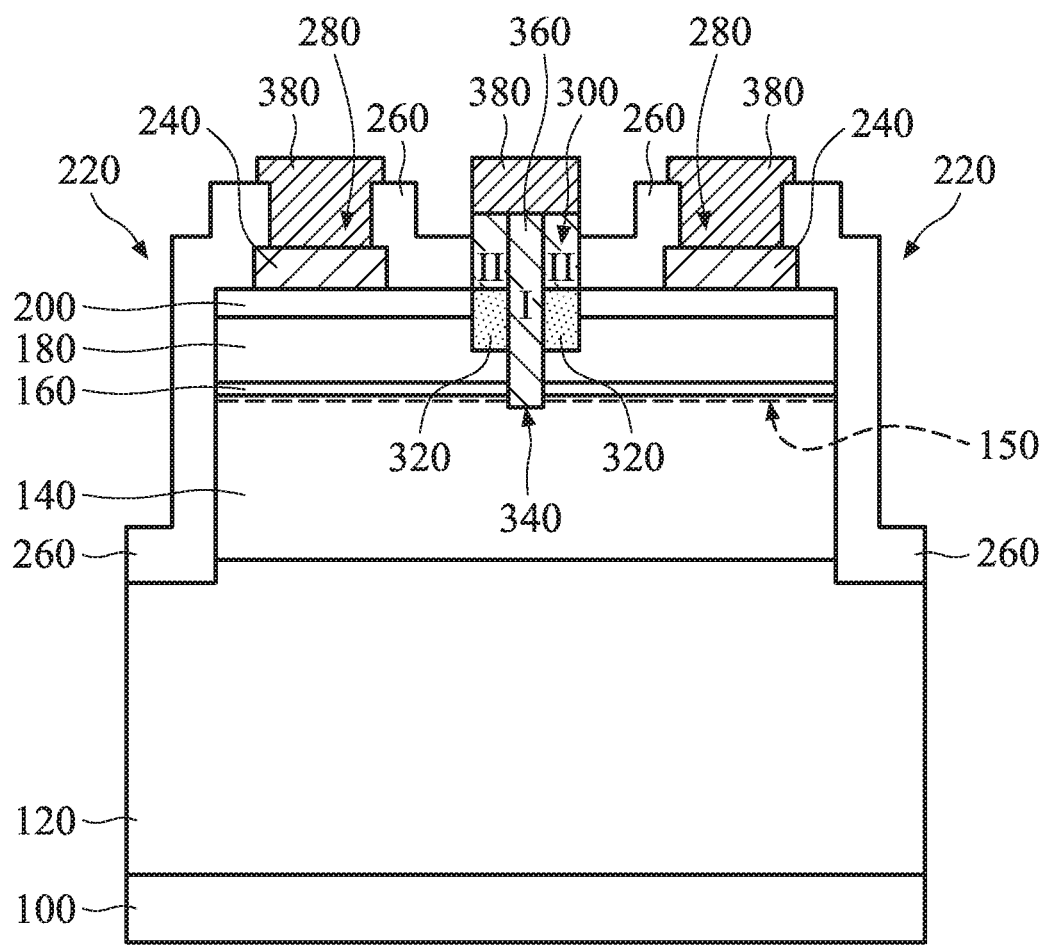
FIG. 4 schematically illustrates a cross-sectional view of a diode device according to one embodiment.

Diode devices according to various embodiments of the invention are subsequently described with reference to FIGS. 2 through 4 schematically illustrating cross-sectional views of diode devices according to various embodiments of the invention, wherein similar elements with those shown in FIG. 1H are indicated by similar reference numerals and/or letters, and the detailed descriptions thereof are abbreviated. The structure of the diode device shown in FIG. 2 is similar to that of the diode device shown in FIG. 1H, in addition to one of the differences that the III-N compound layer shown in FIG. 2 merely comprises the first III-N compound layer 140, the second III-N compound layer 180 and the third III-N compound layer 200, but does not comprise the fourth III-N compound layer 160. The other difference is that the bottom of the opening 300 of the dielectric layer 260 shown in FIG. 2 merely extends into the third III-N compound layer 200, but does not extend into the second III-N compound layer 180, resulting in the top of the high-energy barrier region 320 in the second anode region locating in the third III-N compound layer 200. In this case, it is possible to form the high-energy barrier region 320 with the material of the III-N compound layer doped with materials capable of carrying negative charge or negatively-charged ions (e.g. halogen atoms), an oxide of the Group IIIA elements of the second III-N compound layer 180 and the third III-N compound lay 200, an insulating material (e.g. $SiO_2$, $Si_3N_4$, $Al_2O_3$, AlON or other suitable insulating materials) or a combination thereof. Furthermore, with compared to the embodiment shown in FIG. 2, the bottom of the second anode region II in FIG. 1H is closer to the interface between the first III-N compound layer 140 and the second III-N compound layer 180. The anode region shown in FIG. 2 is composed of the first anode region I, the second anode region II and the third anode region but the anode region may also be composed of only the first anode region I and the second anode region but not comprise the third anode region III.

The structure of the diode device shown in FIG. 3 is similar to that of the diode device shown in FIG. 1H, in addition to the bottom of the opening 300 shown in FIG. 3 merely being located at the bottom of the dielectric layer 260, but not extending into the third III-N compound layer 200, resulting in the top of the high-energy barrier region 320 in the second anode region II being coplanar with the upper surface of the third III-N compound layer 200. In this case, it is possible to select to form the high-energy barrier region 320 with the material of the III-N compound layer doped with materials capable of carrying negative charge or negatively-charged ions (e.g. halogen atoms), an oxide of the Group IIIA elements of the second III-N compound layer 180 and the third III-N compound layer 200, an insulating material (e.g. $SiO_2$, $Si_3N_4$, $Al_2O_3$, AlON or other suitable insulating materials) or a combination thereof. Furthermore, with compared to the embodiment shown in FIG. 3, the bottom of the second anode region II in FIG. 1H is closer to the interface between the first III-N compound layer 140 and the second III-N compound layer 180.

Furthermore, The structure of the diode device shown in FIG. 4 is similar to that of the diode device shown in FIG. 3, in addition to the anode region shown in FIG. 4 merely comprising the first anode region I and the second anode region II, but not comprising the third anode region III. In this case, the first anode region I and the second anode region II may optionally protrude from the upper surface of the dielectric layer 260. In this embodiment, the III-N compound layer first III-N compound layer 140, the second III-N compound layer 180, the third III-N compound layer 200 and the fourth III-N compound layer 160. In other embodiments, however, the III-N compound layer merely comprises the first III-N compound layer 140, the second III-N compound layer 180 and the third III-N compound layer 200, but does not comprise the fourth III-N compound layer 160.

Figure 5A:
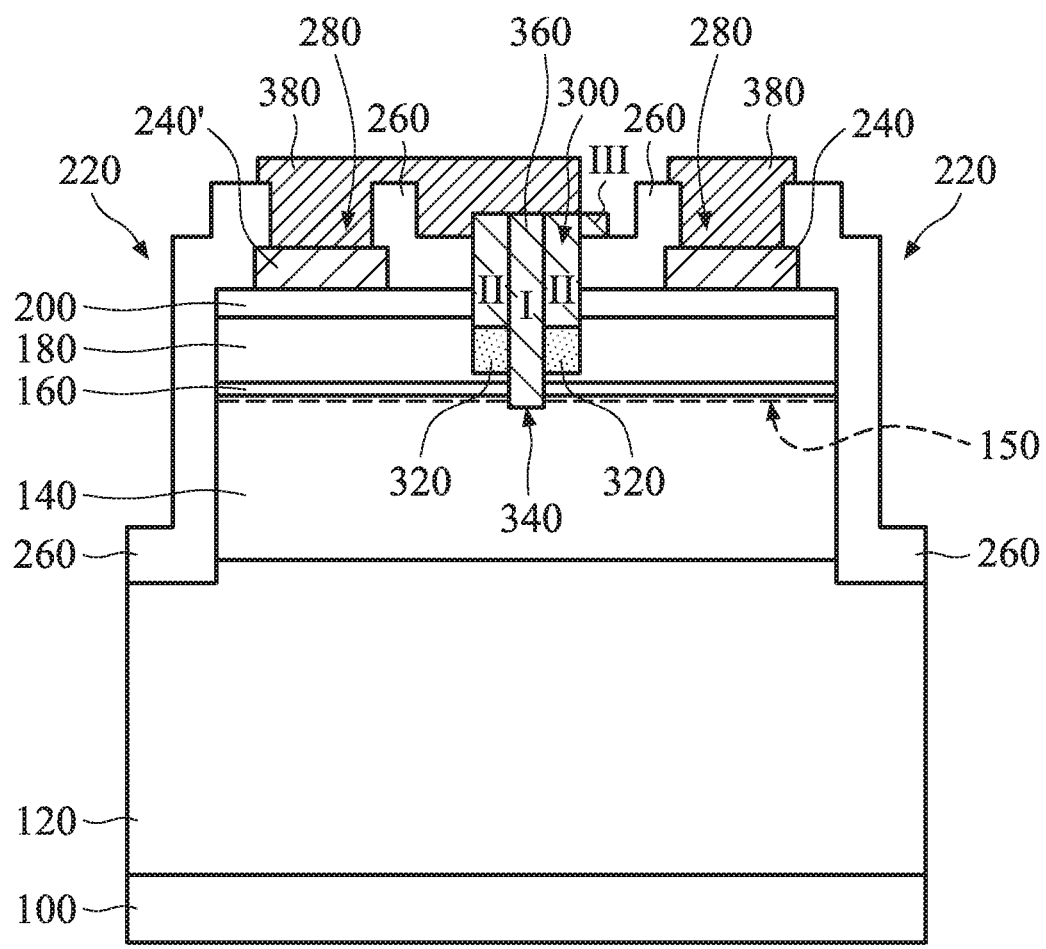
FIGS. 5A and 5B respectively schematically illustrate a cross-sectional view and a plan view of a diode device according to one embodiment.
Figure 5B:
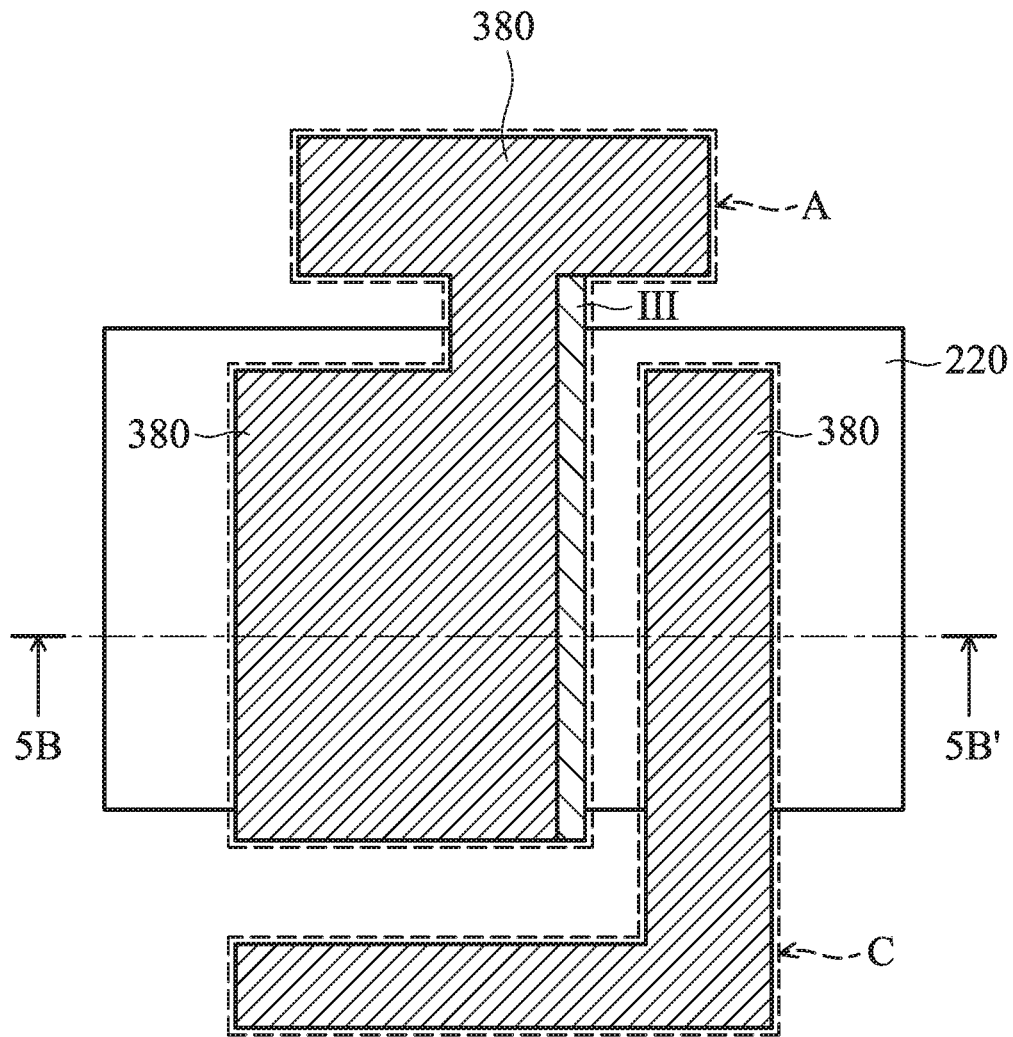

A diode device according to the other embodiment of the invention is subsequently described with reference to FIGS. 5A and 5B respectively schematically illustrating a cross-sectional view and a plan view of the diode device according to the other embodiment of the invention, wherein similar elements with those shown in FIG. 1H are indicated by similar reference numerals and/or letters, and the detailed descriptions thereof are abbreviated. The structure of the diode device shown in FIGS. 5A and 5B is similar to that of the diode device shown in FIGS. 1H and 1I. FIGS. 1H and 1I show the anode electrode A of the diode device is composed of the first anode region I, the second anode region II, the third anode region III and the metal layer 360 directly on the first anode region I and the second anode region II, and parts of the anode electrode A are surrounded by the cathode electrode C as shown in the top view. However, FIGS. 5A and 5B show the metal layer 240' is disposed overlying the III-N compound layer and located away from the cathode region 240, and the metal layer 380 overlying the first anode region I and the second anode region II further extends into the opening 280 and contacts the metal layer 240', resulting in the anode electrode A not surrounded by the cathode electrode C as shown in the top view. In other words, the anode electrode A of the diode device shown in FIGS. 5A and 5B comprises not only the first anode region I, the second anode region II and the third anode region III, but also the metal layer 240' and the metal layer 380 extending from the first anode region I and the second anode region II to the metal layer 240'. In this case, the third anode region III is merely disposed at aside neighboring the cathode region 240/cathode electrode C. Furthermore, it is possible to select the material of the metal layer 240' to be the same with that of the cathode region 240. In general, the Schottky diodes manufactured by use of the AlGaN/GaN heterostructure have the properties of high breakdown voltage and high electric current, but have the problem of having too large a turn-on voltage.

According to the described embodiments of the invention, the anode region is at least divided into the first anode region I conducting main electric current and the second anode region II dispersing electric fields, wherein the first anode region I formed by etching can lower the turn-on voltage and decrease the capacitance of the anode, resulting in the increase of the switching speed of the diode device and the decrease of the switching loss. The first anode region I formed by etching potentially tends to increase the leakage current. In the described embodiments of the invention, however, the second anode region II comprising the high-energy barrier region 320 is further arranged to be neighbored to and surround the first anode region I. The high-energy barrier region 320 can block the leakage current or effectively disperse fringing electric fields of the first anode region I due to a decrease of the concentration of the two-dimensional electron gas below the high-energy barrier region 320, resulting in the technical effects of the decrease of the leakage current and the increase of the breakdown voltage. Therefore, the performance of the Schottky diode devices can be improved.

A method for manufacturing a diode device according to one embodiment of the invention is subsequently described with reference to FIGS. 1A through 1H respectively schematically illustrating a step or stage of a method for manufacturing a diode device according to one embodiment.

Referring to FIG. 1A, a substrate 100 is provided, and a buffer layer 120 is formed overlying the substrate 100. In this embodiment, the substrate 100 may comprise silicon (e.g. silicon (111)), gallium nitride, silicon carbide, sapphire or other suitable materials. Furthermore, the buffer layer 120 may comprise aluminum nitride, aluminum gallium nitride, a combination thereof or other suitable materials.

Next, A III-N compound layer is grown overlying the buffer layer 120. In this embodiment, the III-N compound layer comprises a first III-N compound layer 140, a fourth III-N compound layer 160, a second III-N compound layer 180 and a third III-N compound layer 200 sequentially stacked from bottom to top. In other embodiments, the III-N compound layer merely has the first III-N compound layer 140, the second III-N compound layer 180 and the third III-N compound layer 200, but the III-N compound layer does not comprise the fourth III-N compound layer 160, as shown in FIG. 2. In this embodiment, the first III-N compound layer 140 may comprise GaN, AlGaN or other suitable nitrides of Group IIIA elements, the second III-N compound layer 180 may comprise AlGaN, AlInN, AlInGaN or other suitable nitrides of Group IIIA elements, the third III-N compound layer 200 may comprise GaN, AlN or other suitable nitrides of Group IIIA elements, and the fourth III-N compound layer 160 may comprise AlN or other suitable nitrides of Group IIIA elements. In this embodiment, there is two-dimensional electron gas (2DEG) 150 in the III-N compound layer, and the two-dimensional electron gas 150 acts as a channel radon of the diode device. The two-dimensional electron gas 150 is disposed in the first III-N compound layer 140 and neighboring an interface between the first III-N compound layer 140 and the second III-N compound layer 180.

Next, referring to FIG. 1B, an isolation region 220 is used for defining active regions, resulting in a plurality of devices isolated from each other (for simplicity, only one single active region is shown in FIGS. 1A through 1H). For example, a photoresist can be firstly formed by use of a deposition process (e.g. a spin coating process), and the photoresist is utilized as an etching mask layer. Next, a photolithography process is performed to define a pattern of the active regions, followed by performance of a dry etch process (e.g. a plasma etching process) to further form openings to complete the isolation region 220. The isolation region 220 composed of the openings surrounds the III-N compound layer and exposes parts of the buffer layer 120. In other embodiment, the isolation region 220 can be formed by performance of an ion implanting process on the III-N compound layer, and is therefore formed in the III-N compound layer. In this case, the isolation region 220 is constructed by the III-N compound layer doped with ions, and an upper surface of the isolation region 220 is coplanar with an upper surface of the III-N compound layer of the active regions.

Referring to FIG. 1C, a cathode region 240 is formed overlying the third III-N compound layer 200 of the III-N compound layer. For example, first, a photoresist mask layer can be formed by a deposition process e.g. a spin coating process or other suitable processes), and then a photolithography process is performed to define the pattern of the cathode region 240, followed by performance of an evaporation process or other suitable processes to form a material layer of the cathode region 240. Next, the photoresist mask layer is removed, and a rapid thermal annealing (RTA) process is performed. As a result, the formation of the cathode region 240 is completed. In this embodiment, the cathode region 240 is composed of a composite structure of Ti/Al/Ni/Au or other suitable metallic materials, and the cathode region 240 comprises an ohmic metal.

Referring to FIG. 1D, a dielectric layer 260 can be formed overlying the cathode region 240 and the third III-N compound layer 200 of the III-N compound layer by a deposition process (e.g. a plasma-enhanced chemical vapor deposition (PECVD) process or other suitable processes). The dielectric layer 260 conformally extends to the sidewalls and bottoms of the isolation region 220, and therefore covers and contacts the exposed buffer layer 120. In this embodiment, the dielectric layer 260 can be composed of a single-layered or multi-layered structure. For example, the dielectric layer 260 may comprise $SiO_2$, $Si_3N_4$, $Al_2O_3$, $HfO_2$, a combination thereof or other suitable dielectric materials. The dielectric layer 260 is capable of preventing the diode device from oxidization and affecting the electrical properties of the diode device.

Referring to FIG. 1E, using a plasma treatment (e.g. a plasma etching process), a plurality of openings 280 corresponding to the cathode region 240 and an opening 300 between the openings 280 are formed in the dielectric layer 260, and a high-energy barrier region 320 is formed in the second III-N compound layer 180 underlying the opening 300. The openings 280 expose parts of the cathode region 240, and the opening 300 extends from an upper surface of the dielectric layer 260 into the second III-N compound layer 180. The high-energy barrier region 320 extends downwardly from the bottom of the opening 300, but does not extend into the fourth III-N compound layer 160 and the first III-N compound layer 140. Therefore, the bottom of the high-energy barrier region 320 is located in the second III-N compound layer 180. In this embodiment, the high-energy barrier region 320 is formed by the material of the III-N compound layer doped with materials capable of carrying a negative charge or negatively-charged ions (e.g. halogen atoms). For example, the halogen atoms may be fluorine atoms, chlorine atoms or other suitable halogen atoms.

In this embodiment, the opening 300 of the dielectric layer 260 extends downwardly into the second III-N compound layer 180, resulting in the top of the high-energy barrier region 320 being located in the second III-N compound layer 180. In other embodiments, the bottom of the opening 300 may merely extend into the third III-N compound layer 200, resulting in the top of the high-energy barrier region 320 located in the third III-N compound layer 200, as shown in FIG. 2.

Referring to FIG. 1F, an opening 340 is formed in the high-energy barrier region 320. The opening 340 extends downwardly from the bottom of the opening 300 through the fourth III-N compound layer 160 into the first III-N compound layer 140. For example, a photoresist can be formed by a deposition process (e.g. a spin coating process), and the photoresist is utilized as an etching mask layer. Then, the pattern of the opening 340 is defined by the performance of a photolithography process, followed by the performance of a dry etching process (e.g. plasma etching process) to form the opening 340. In this embodiment, the bottom of the opening 340 is below the two-dimensional electron gas 150, and the opening 340 is surrounded by the high-energy barrier region 320.

Referring to FIG. 1G, a metal layer 360 is formed overlying the dielectric layer 260 and completely fills the opening 300 and the opening 340. For example, a photoresist can be formed by a deposition process (e.g. a spin coating process), and the photoresist is utilized as an etching mask layer. Then, a pattern is defined by the performance of a photolithography process, followed by the performance of an evaporation process or other suitable processes to form the metal layer 360. Thereafter, the photoresist is removed. In this embodiment, the metal layer 360 comprises a composite structure of Ni/Au or other suitable metallic materials.

The metal layer 360 and the high-energy barrier region 320 form an anode region of the diode device. The anode region can be generally divided into a first anode region I, a second anode region II and a third anode region III according to their functionality. The first anode region I comprises a Schottky metal and acts as an electrode region conducting main electric current. The second anode region II at least comprises a material with high-energy barrier to effectively disperse fringing electric fields of the anode. The third anode region III acts as a field-plate region for enhancing the dispersion of the electric fields.

Specifically, the first anode region I is composed of the metal layer 360 extending vertically and upwardly from the bottom of the opening 340 to above the dielectric layer 260. In other words, the first anode region I extends vertically and downwardly from the top of the metal layer 360 above the dielectric layer 260 into the first III-N compound layer 140, and the bottom of the first anode region I is located below the two-dimensional electron gas 150. Furthermore, the second anode region II is composed of the high-energy barrier region 320 and the metal layer 360 extending vertically and upwardly from the top of the high-energy barrier region 320 to above the dielectric layer 260. In other words, the second anode region II extends vertically and downwardly from above the dielectric layer 260 into the second III-N compound layer 180, and the bottom of the second anode region II is located in the second III-N compound layer 180. The second anode region II does not extend into the first III-N compound layer 140 and the fourth III-N compound layer 160, and therefore can prevent any affects to the turn-on voltage. The third anode region III is composed of the metal layer 360 beyond the first anode region I and the second anode region II, and the third anode region III is completely located above the dielectric layer 260 without extending into the opening 300 of the dielectric layer 260.

In this embodiment, the first anode region I is formed by etching, and the region beside the high-energy barrier region 320 in the second anode region II is also formed by etching. Therefore, the turn-on voltage of the diode device can be effectively decreased. Furthermore, the second anode region II surrounds the first anode region I, and the third anode region III surrounds the second anode region II and first anode region I in the top view.

In this embodiment, the high-energy barrier region 320 in the second anode region II is adjacent to sidewalls of the first anode region I, and the high-energy barrier region 320 merely partially covers the sidewalk of the first anode region I, exposing the parts, neighboring the two-dimensional electron gas (channel region), of the first anode region I. Furthermore, the high-energy barrier region 320 exposes the parts, above the third III-N compound layer 200, of the first anode region I. In this embodiment, the first anode region I, the second anode region II and the third anode region III are simultaneously formed by the same process. In other embodiments, however, the first anode region I, the second anode region II and the third anode region III are formed by different steps of the process. Therefore, the material of the first anode region I can be selected to be the same as or different from the material of the second anode region II and/or the third anode region III.

In this embodiment, the anode region of the diode device is composed of the first anode region I, the second anode region II and third anode region III. However, the anode region can be merely composed of the first anode region I and second anode region II, but does not comprise the third anode region III. For example, it is possible to merely fill the metal layer 360 within the opening 300, but not to extend the metal layer 360 from the opening 300 to the upper surface of the dielectric layer 260, as shown in FIG. 4.

Referring to FIG. 1H, a metal layer 380 is formed overlying the metal layer 360 and the dielectric layer 260. The metal layer 380 further completely fills the openings 280 of the dielectric layer 260, forming electrodes overlying the cathode region 240, the first anode region I and the second anode region II for the diode device to electrically connect to the exterior device. For example, first, a photoresist mask is formed by a deposition process (e.g. a spin coating process or other suitable processes), followed by the performance of a photolithography process to define patterns. Then, the metal layer 380 is formed by an evaporation process or other suitable processes, followed by removal of the photoresist mask layer. In this embodiment, the metal layer 380 comprises a composite structure of Ti/Au, Ti/Al or other suitable metallic materials.

In the described manufacturing method shown in FIGS. 1A through 1H, the openings 280 and the opening 300 are formed in the dielectric layer 260 by a plasma etching process, and simultaneously, halogen atoms (e.g., fluorine atoms, chlorine atoms or other suitable halogen atoms) are doped into the III-N compound layer below the opening 300, resulting in the formation of the high-energy barrier region 320. At this time, the top of the high-energy barrier region 320 is at least located below the upper surface of the third III-N compound layer 200. For example, the top of the high-energy barrier region 320 is located in the third III-N compound layer 200 or the second III-N compound layer 180.

In another embodiment, it is possible to firstly form the openings 280 and the opening 300 in the dielectric layer 260 utilizing other suitable etching processes, followed by performance of an ion implantation process implanting halogen atoms (e.g. fluorine atoms, chlorine atoms or other suitable halogen atoms) into the interior of the III-N compound layer below the opening 300 to form the high-energy barrier region 320. At this time, the top of the high-energy barrier region 320 is coplanar with the upper surface of the third III-N compound layer 200, as shown in FIG. 3 or 4.

In yet another embodiment, it is possible to firstly form the openings 280 and the opening 300 in the dielectric layer 260 utilizing other suitable etching processes, followed by performance of an oxidization process oxidizing the second III-N compound layer 180 and the third anode region III below the opening 300 to form the high-energy barrier region 320 composed of an oxide of Group IIIA element. At this time, the top of the high-energy barrier region 320 is coplanar with the upper surface of the third III-N compound layer 200, also as shown in FIG. 3 or 4. In other embodiments, however, the top of the high-energy barrier region 320 composed of an oxide of Group IIIA element can be selectively lower than the upper surface of the third III-N compound layer 200.

In other embodiments, it is possible to firstly form the openings 280 and the opening 300 in the dielectric layer 260 utilizing other suitable etching processes, wherein the opening 300 further passes through the third III-N compound layer 200 and extends into the second III-N compound layer 180. Next, a deposition process is performed, and the interior of the opening 300 is filled with an insulating material (e.g. $SiO_2$, $Si_3N_4$, $Al_2O_3$, AlON or other suitable insulating materials) to form the high-energy barrier region 320 composed of the insulating material.

When the opening 300 disposed in the second III-N compound layer 180 is merely partially filled with the described insulating material, the top of the high-energy barrier region 320 is lower than the upper surface of the second III-N compound layer 180, as shown in FIG. 1H. When the described insulating material completely fills the opening 300 in the second III-N compound layer 180 but fails to completely fill the opening 300 in the third III-N compound layer 200, the top of the high-energy barrier region 320 is lower than the upper surface of the third III-N compound layer 200, as shown in FIG. 2. When the described insulating material completely fills the opening 300 in the second III-N compound layer 180 and the third III-N compound layer 200, the top of the high-energy barrier region 320 is coplanar with the upper surface of the third III-N compound layer 200, as shown in FIG. 3 or 4. Furthermore, the described insulating material may also selectively protrude from the upper surface of the third III-N compound layer 200. That is, the top of the high-energy barrier region 320 is higher than the upper surface of the third III-N compound layer 200.

In the manufacturing methods shown in FIGS. 1A through 1H and FIGS. 2 through 4, a patterned photoresist is formed by a deposition process and a photolithography process, and then, the metal layer 380 is formed by an evaporation process or other suitable processes. Therefore, the patterned metal layer 380 is formed overlying the metal layer 360 and the dielectric layer 260, and the patterned metal layer 380 forms electrodes independent and isolated from each other in the cathode region 240, the first anode region I and the second anode region II, as shown by the cathode electrode C and the anode electrode A in FIG. 1I. In other embodiments, as shown in FIGS. 5A and 5B, the patterned metal layer 380 is formed by the same processes as described, while parts of the metal layer 380 extend from above the first anode region I and second anode region II into the openings 280. Therefore, the parts of the metal layer 380 contact the metal layer 240', but are isolated and independent from the other metal layer 380 directly on the cathode region 240 with each other. Therefore, in FIGS. 5A and 5B, the anode electrode A comprises not only the first anode region I, the second anode region II and the third anode region III, but also the metal layer 240 and the metal layer 380 electrically connecting the metal layer 240' to the first anode region I and the second anode region II. At this time, the third anode region III is merely formed at one side neighboring the cathode region 240/cathode electrode C. Furthermore, the methods and steps forming the metal layer 240' can be selected to be the same as the method and step forming the cathode region 240.

According to various described embodiments of the invention, the anode region (including the first anode region I and the second anode region II) of the diode device is formed by the plasma etching process or by the etching process corresponding to the ion implanting process, oxidization process or deposition process. Therefore, it is not only possible to increase the switching speed and decrease the switching loss due to the decrease to the turn-on voltage and the decrease to the capacitance of the anode, but it is also possible to overcome the problem of having too large a leakage current due to the performance of blocking the leakage current or dispersing electric fields provided by the high-energy barrier region in the anode region. Therefore, according to the various embodiments of the invention, the quality and performance of the Schottky diode device can be effectively improved by the use of simple process steps.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A diode device, comprising:
    a III-N (a nitride of a Group IIIA element) compound layer comprising a channel region therein;
    a cathode region disposed overlying the III-N compound layer;
    a first anode region disposed overlying the III-N compound layer and extending into the III-N compound layer, wherein a bottom of the first anode region is disposed underlying the channel region; and
    a second anode region disposed overlying the III-N compound layer between the cathode region and the first anode region and extending into the III-N compound layer, wherein the second anode region comprises a high-energy barrier region adjacent to a sidewall of the first anode region.

2. The diode device as claimed in claim 1, wherein the high-energy barrier region partially covers the sidewall of the first anode region and exposes a part, neighboring the channel region, of the sidewall.

3. The diode device as claimed in claim 1, wherein a top of the high-energy barrier region is disposed in the III-N compound layer.

4. The diode device as claimed in claim 1, wherein a top of the high-energy harrier region is coplanar with a top surface of the III-N compound layer.

5. The diode device as claimed in claim 1, wherein the high-energy barrier region comprises a material including the nitride in the III-N compound layer, and the material further comprises halogen atoms.

6. The diode device as claimed in claim 1, wherein the high-energy barrier region comprises an oxide of the Group IIIA element composed by the nitride in the III-N compound layer.

7. The diode device as claimed in claim 1, wherein the high-energy barrier region comprises an insulating material.

8. The diode device as claimed in claim 1, further comprising a third anode region disposed overlying the III-N compound layer, wherein the second anode region is disposed between the third anode region and the first anode region.

9. The diode device as claimed in claim 1, wherein the III-N compound layer comprises a first III-N compound layer, a second III-N compound layer and a third III-N compound layer sequentially stacked from bottom to top, the channel region is neighboring an interface between the first III-N compound layer and the second III-N compound layer, and a bottom of the high-energy barrier region is disposed in the second III-N compound layer.

10. The diode device as claimed in claim 9, wherein the III-N compound layer further comprises a fourth III-N compound layer disposed between the first III-N compound layer and the second III-N compound layer, wherein the sidewall, exposed by the high-energy barrier region, of the first anode region comprises apart above the third III-N compound layer.

11. The diode device as claimed in claim 1, further comprising:
a first metal layer disposed overlying the III-N compound layer and located away from the cathode region; and
a second metal layer extending from the first anode region and the second anode region to the first metal layer.

12. A method for manufacturing a diode device, comprising:
providing a III-N (a nitride of a Group IIIA element) compound layer, the III-N compound layer comprising a channel region therein;
forming a cathode region overlying the III-N compound layer;
forming a first anode region overlying the III-N compound layer, wherein the first anode region extends into the III-N compound layer, and a bottom of the first anode region is disposed underlying the channel region; and
forming a second anode region overlying the III-N compound layer between the cathode region and the first anode region, wherein the second anode region extends into the compound layer, and the second anode region comprises a high-energy barrier region adjacent to a sidewall of the first anode region.

13. The method as claimed in claim 12, wherein the high-energy barrier region partially covers the sidewall of the first anode region and exposes a part, neighboring the channel region, of the sidewall.

14. The method as claimed in claim 12, wherein a top of the high-energy barrier region is disposed in the III-N compound layer.

15. The method in claim 12, wherein a top of the high-energy barrier region is coplanar with a top surface of the III-N compound layer.

16. The method as claimed in claim 12, wherein the high-energy barrier region is formed by doping halogen atoms into a material including the nitride in the III-N compound layer.

17. The method as claimed in claim 12, wherein the high-energy barrier region is formed by oxidizing a material including the nitride in the III-N compound layer into an oxide of the Group IIIA element.

18. The method as claimed in claim 12, wherein high-energy barrier region comprises an insulating material.

19. The method as claimed in claim 12, further comprising forming a third anode region overlying the III-N compound layer, wherein the second anode region is disposed between the third anode region and the first anode region.

20. The method as claimed in claim 12, wherein the III-N compound layer comprises a first III-N compound layer, a second III-N compound layer and a third III-N compound layer sequentially stacked from bottom to top, the channel region is neighboring an interface between the first III-N compound layer and the second III-N compound layer, and a bottom of the high-energy barrier region is disposed in the second III-N compound layer.

21. The method as claimed in claim 20, wherein the III-N compound layer further comprises a fourth III-N compound layer disposed between the first III-N compound layer and the second III-N compound layer, wherein the sidewall, exposed by the high-energy barrier region, of the first anode region comprises a part above the third III-N compound layer.

22. The method as claimed in claim 12, further comprising:
forming a first metal layer overlying the III-N compound layer, wherein the first metal layer is located away from the cathode region; and
forming a second metal layer extending from the first anode region and the second anode region to the first metal layer.

* * * * *